United States Patent [19]

Stefani et al.

[11] Patent Number: 4,549,095
[45] Date of Patent: Oct. 22, 1985

[54] CONTROL CIRCUIT FOR SWITCHING INDUCTIVE LOADS

[75] Inventors: Fabrizio Stefani, Cardano al Campo; Carlo Cini, Cornaredo; Claudio Diazzi, Milan, all of Italy

[73] Assignee: SGS-Ates Componenti Elettronici S.p.A., Agrate Brianza, Italy

[21] Appl. No.: 441,851

[22] Filed: Nov. 15, 1982

[30] Foreign Application Priority Data

Nov. 13, 1981 [IT] Italy ............................ 25054 A/81

[51] Int. Cl.[4] .................... H03K 17/60; H03K 3/26
[52] U.S. Cl. .................................. 307/254; 307/270; 307/300; 307/315
[58] Field of Search ............... 307/255, 254, 270, 300, 307/315

[56] References Cited

U.S. PATENT DOCUMENTS

| | | | |
|---|---|---|---|
| 3,958,136 | 5/1976 | Schroeder | 307/254 |
| 4,092,551 | 5/1978 | Howard et al. | 307/254 |
| 4,318,011 | 3/1982 | Zeis | 307/300 |
| 4,404,478 | 9/1983 | Rischmüller | 307/300 |
| 4,461,979 | 7/1984 | Jeenicke et al. | 307/300 |

FOREIGN PATENT DOCUMENTS 2053606A 4/1981 United Kingdom .

Primary Examiner—Stanley D. Miller
Assistant Examiner—B. P. Davis
Attorney, Agent, or Firm—Wenderoth, Lind & Ponack

[57] ABSTRACT

A control circuit for switching inductive loads which can be monolithically integrated and used in high-speed printing equipment and in chopper power supply systems. The circuit includes a final power transistor, driven for switching by means of a drive transistor coupled to its control terminal. A speedup circuit is connected to the control terminals of both of the transistors in order to accelerate the turning off of the transistors by reducing the discharge time thereof. Such a speedup circuit is enabled so as to remove charge carriers only for a period of time which begins when the transistors are turned off in order to avoid additional time delays when the transistors are subsequently turned on again.

20 Claims, 2 Drawing Figures

CONTROL CIRCUIT FOR SWITCHING INDUCTIVE LOADS

BACKGROUND OF THE INVENTION

The present invention relates to a control circuit for switching inductive loads which can be monolithically integrated and used in high-speed printing equipment to drive the electromagnets of the printing elements and in chopper power supply systems.

A control circuit for switching in accordance with the present invention comprises a final power transistor which is connected in series with an inductive load, the pair being connected between two terminals of a D.C. voltage supply. The transistor is driven alternately, by means of a base control signal, from a first state of high voltage and low current to a second state of low voltage and high current.

In the first state, the transistor is virtually an open circuit between the emitter and collector terminals, (i.e.—the open or "off" state), and in the second state, the transistor is essentially a short-circuit between the emitter and collector terminals, (i.e.—the conductive or "on" state), thereby respectively preventing or allowing a current to flow through the inductive load.

The operating mode of the transistor which is closest to the operation of an ideal switch is that in which the transistor operates at saturation when in its conductive or on state and is turned off in its open or off state. In this case, the maximum possible switching frequency of the final power transistor is essentially limited, during the transition phase from the saturation state to the off state, by the effects of the charge storage of the transistor which has occurred during the conductive state.

As is known, power transistors generally have a thick collector region having a high resistivity, since it is necessary for the transistor to withstand a high reverse voltage.

This region of the collector has a turn off transient operation constituted by a first phase in which the transistor continues to be saturated, a second phase of "semi-saturation" in which the collector-emitter voltage starts to rise, but the collector current remains constant, and a final phase in which the collector-emitter voltage rises rapidly and the collector current reduces to zero.

The phase of "semi-saturation" is, in particular, that phase in which the transistor dissipates the most energy.

Therefore, a reduction in the turn-off time would be advantageous both for increasing the maximum possible switching frequency and for improving the efficiency of the control circuit from the point of view of energy consumption, thereby reducing the times in which the operation of the final power transistor is different from that of an ideal switch.

A known circuit solution of the abovenoted problem is to connect a low impedance circuit means to the base of the final power transistor. When the transistor is turned off, this circuit means allows a rapid removal of the charge carriers stored in the transistor. As an example, such a circuit means comprises a transistor of suitable dimensions, connected to the base of the final transistor, which functions in phase opposition with respect to the latter, and removes the stored charge in order to accelerate the turn-off of the final transistor.

Circuit solutions of this prior art type are described, for example, in the United Kingdom patent application No. 2,053,606 and U.S. Pat. No. 4,092,551.

However, even the charge removal or speed up transistor has its own turn-off time, although small. Thus, since the charge removal transistor operates in a conduction state which is opposite to that of the final power transistor, the charge removal transistor determines the time delay for again turning on the final power transistor, and such a time delay is not negligable if the maximum switching speed is desired. On the other hand, not even the useless absorption of supply current used to keep the charge removal transistor active when the final transistor is already completely turned off can be entirely disregarded.

When the base control signal is transmitted to the final power transistor by means of a second transistor coupled thereto, the operating speed of the control circuit also depends upon the maximum switching speed of this second transistor, which in turn depends upon the effects already noted of storing a charge in the base thereof if the second transistor operates at saturation in its conductive state.

In this case, the speed limitations which derive therefrom can be considerable, especially for control circuits which are monolithically integrated and comprise a PNP type transistor for driving the final power transistor (which is generally of an NPN type for reasons relating to the integration thereof, as is well known to persons skilled in the semiconductor art ). Even when the final output transistor is in its conductive state, it operates in the active zone of its operating range, since such integrated PNP type transistors inherently have a longer turn-off time than that of NPN transistors.

SUMMARY OF THE INVENTION

The object of the present invention is to construct a control circuit for switching inductive loads which can be monolithically integrated and which comprises a PNP type transistor used for driving the final power transistor, and which is characterized by a very high switching speed, a high efficiency, and is effective to limit the supply current.

BRIEF DESCRIPTION OF THE DRAWINGS

The invention will be better understood from the following detailed description, given purely by way of a non-limitative example with respect to the attached drawings in which.

DESCRIPTION OF THE PREFERRED EMBODIMENTS

Figure 1:
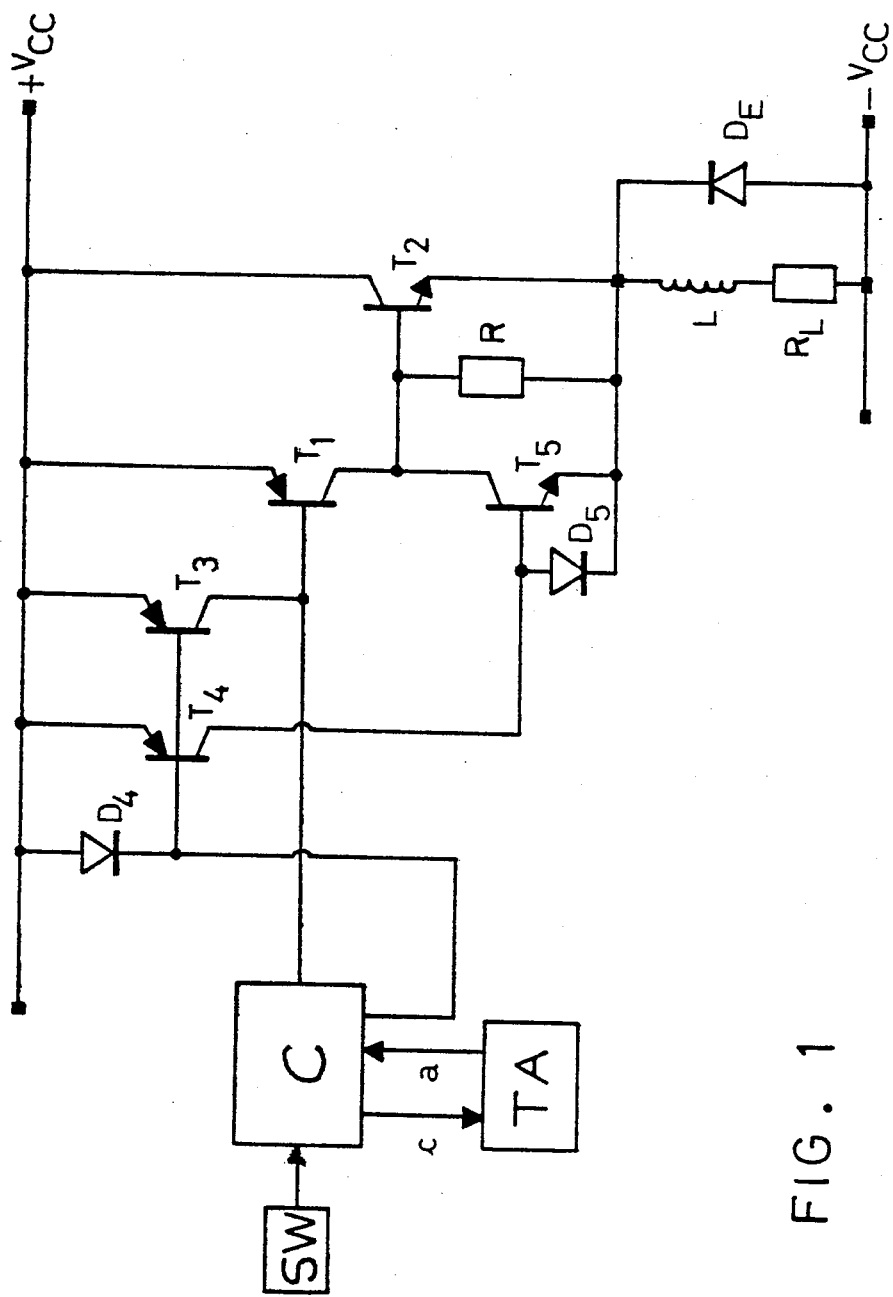
FIG. 1 is a circuit diagram, partially in block form, of a switching control circuit according to the present invention.

The diagram of a switching control circuit, as shown in FIG. 1, comprises a source of switching signals represented by a block marked SW, connected to a control circuit means, represented by a block C and further comprising a pair of bipolar transistors, indicated by the symbols $T_1$ and $T_2$, respectively of PNP type and NPN type conductivity. The base, emitter and collector of $T_1$ are respectively connected to the control circuit means C, to a positive terminal $+V_{cc}$ of a D.C. supply voltage and to the base of the transistor $T_2$; the collector and emitter of transistor $T_2$ are respectively connected to $+V_{cc}$ and to an inductive load, represented by a resistor $R_L$ and an inductance L, which are connected in series to a negative terminal $-V_{cc}$ of the D.C. supply voltage. A diode $D_E$, having its cathode and anode respectively connected to the emitter of transistor $T_2$ and to $-V_{cc}$ is connected in parallel to the series combination of $R_L$ and L. The base and emitter of transistor $T_2$ are connected together by means of a resistor R.

The circuit, as shown in FIG. 1, also comprises a timed enabling circuit means, represented by a block marked TA. The block TA is coupled to the control circuit means C by a double connection indicated by the letters c and a; two bipolar transistors of a PNP type conductivity, $T_3$ and $T_4$, and a bipolar transistor of an NPN type conductivity $T_5$ are also included in the circuit.

The bases of transistors $T_3$ and $T_4$ are both connected to the circuit means C and to the cathode of a diode $D_4$, the anode of which is connected to $+V_{cc}$.

The emitters of transistors $T_3$ and $T_4$ are connected to $+V_{cc}$; the collector of transistor $T_3$ is connected to the base of transistor $T_1$; the collector of transistor $T_4$ is connected to the base of transistor $T_5$ and to the anode of a diode $D_5$.

The emitter of transistor $T_5$ and the cathode of diode $D_5$ are connected to the emitter of transistor $T_2$; the collector of transistor $T_5$ is connected to the base of transistor $T_2$.

Figure 2:
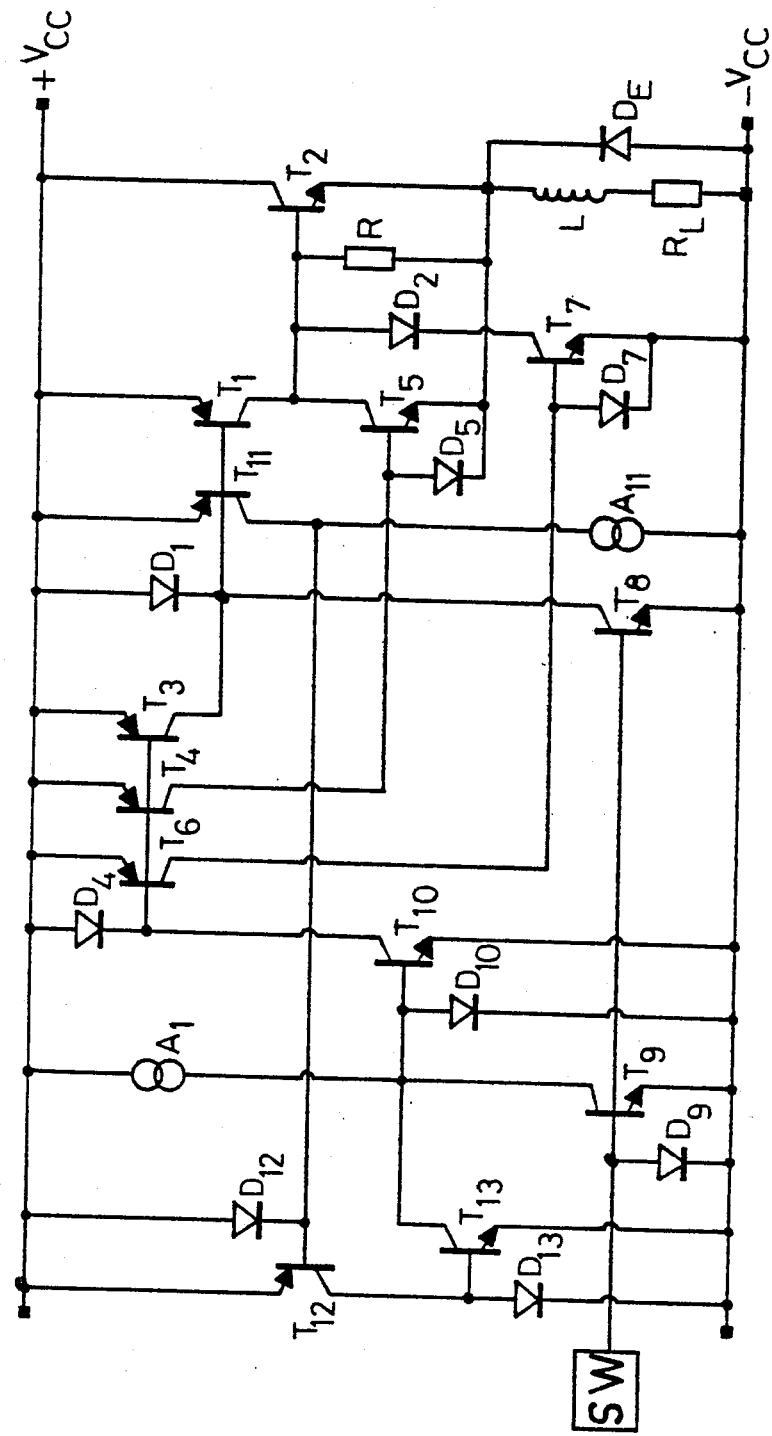
FIG. 2 is a circuit diagram of a different embodiment of the present invention. In the drawing figures, the same reference letters and numbers are used for corresponding parts.

FIG. 2 shows the circuit diagram of a different embodiment of the invention. The different embodiment includes all of the elements shown in the circuit diagram of FIG. 1 and, in addition, includes diodes $D_2$ and $D_7$ and a bipolar transistor $T_6$ of a PNP type conductivity and a bipolar transistor $T_7$ of an NPN type conductivity.

The base of transistor $T_6$ is also connected to the cathode of diode $D_4$ and to the control circuit means (which is shown in detail in FIG. 2).

The emitter and collector of transistor $T_6$ are respectively connected to $+V_{cc}$ and to the anode of diode $D_7$. The base of transistor $T_7$ is also connected to the anode of diode $D_7$. The cathode of diode $D_7$ and the emitter of transistor $T_7$ are connected to $-V_{cc}$; the collector of transistor $T_7$ is connected to the cathode of diode $D_2$; the anode of diode $D_2$ is also connected to the base of transistor $T_2$.

In addition, in the circuit diagram of FIG. 2, a particular circuit configuration for the blocks C and TA of FIG. 1 is shown in detail.

The control circuit means, represented in FIG. 1 by the block C, comprises three bipolar transistors $T_8$, $T_9$ and $T_{10}$ of an NPN type conductivity.

The bases of transistors $T_8$ and $T_9$ are both connected to the source of the switching signals SW and to the anode of a diode $D_9$; the cathode of diode $D_9$ is connected to $-V_{cc}$.

The emitter of transistor $T_8$ is connected to $-V_{cc}$ and the collector of transistor $T_8$ is connected to the base of transistor $T_1$ and to the cathode of a diode $D_1$; the anode of diode $D_1$ is connected to $+V_{cc}$. The collector of transistor $T_9$ is connected to the base of transistor $T_{10}$, and to $+V_{cc}$ by means of a constant current generator $A_1$ and to the anode of a diode $D_{10}$; the emitters of transistors $T_9$ and $T_{10}$ and the cathode of diode $D_{10}$ are connected to $-V_{cc}$. The collector of transistor $T_{10}$ is connected to the bases of transistors $T_3$, $T_4$, and $T_6$ and to the cathode of the diode $D_4$.

The timed enabling circuit means comprises two bipolar transistors $T_{11}$ and $T_{12}$ of a PNP type conductivity and a bipolar transistor $T_{13}$ of an NPN type conductivity. The base of transistor $T_{11}$ is also connected to the cathode of the diode $D_1$ and to the collector of the transistor $T_8$; the emitter and collector of transistor $T_{11}$ are respectively connected to $+V_{cc}$ and to the base of transistor $T_{12}$ which is connected to the cathode of a diode $D_{12}$; the anode of diode $D_{12}$ is connected to $+V_{cc}$; the collector of transistor $T_{11}$ is also connected to $-V_{cc}$ by means of a constant current generator $A_{11}$.

The emitter of transistor $T_{12}$ is connected to $+V_{cc}$; the collector of transistor $T_{12}$ is connected to the base of transistor $T_{13}$ and to the anode of a diode $D_{13}$; the cathode of diode $D_{13}$ is connected to $-V_{cc}$. The emitter and the collector of transistor $T_{13}$ are respectively connected to $-V_{cc}$ and to the collector transistor of $T_9$.

The operation of the circuit represented in FIG. 1 will now be examined in detail below.

The diode $D_4$ forms a first current mirror circuit with transistor $T_3$ and simultaneously forms a second more complex current mirror circuit with the assembly of transistor $T_4$, diode $D_5$ and transistor $T_5$. The connection between the diode $D_4$ and the control circuit means C is the common input to the two current mirror circuits; the connection between the collector of transistor $T_3$ and the base of transistor $T_1$ and the connection between the collector of transistor $T_5$ and the base of transistor $T_2$ are the separate outputs of the two current mirror circuits. The input current is mirrored in the outputs with fixed current transfer factors.

The control circuit means C simultaneously activates the first and the second current mirror circuits when, in correspondance with a fixed switching signal generated by the signal source SW, it controls the turn-off of transistor $T_1$ and consequently that of transistor $T_2$. Thus, a charge removal current from the base of transistor $T_1$ is determined. On one hand, a charge absorption current from the collector of transistor $T_1$ in the turn-off phase is determined and, on the other hand, the charge removal current from the base of transistor $T_2$ is determined. As has already been stated, these currents are proportional to the current imposed by the control circuit.

The timed enabling circuit means TA detects, by means of the connection c to the circuit means C, the turn-off control of transistors $T_1$ and $T_2$ and enables the circuit means C to keep the current mirrors active for a fixed period of time.

If a new switching signal arrives during this period of time from SW, circuit means C controls the turning on again of transistors $T_1$ and $T_2$, and the deactivation of the current mirror circuits and the reinstatement of the initial conditions of TA.

Otherwise, at the end of the fixed period of time, circuit means TA, by means of the connection a, orders circuit means C to deactivate the current mirror circuits, but without changing the state of transistors $T_1$ and $T_2$.

The operation of a control circuit for switching according to the present invention will be better understood by explaining in particular the operation of the circuit activation shown in FIG. 2. In contrast to the circuit diagram of FIG. 1, the circuit diagram of FIG. 2 also comprises a third current mirror circuit formed by diode $D_4$, transistor $T_6$, diode $D_7$, transistor $T_7$ and diode $D_2$ and their respective connections. The input of the third current mirror circuit is common to the first and second current mirror circuits, and its output, which is separate from that of the other two current mirror circuits, is also connected to the base of transistor $T_2$ and allows a more efficient charge removal from this transistor when it is in the turn-off phase.

The third current mirror circuit is activated simultaneously with the first and second current mirror circuits. Initially, the collector-emitter voltage of transistor $T_7$ is higher than that of transistor $T_5$, which is equal to the base-emitter voltage of transistor $T_2$ in its conductive state, because the emitter of transistor $T_7$ is connected to the negative voltage $-V_{cc}$. Therefore, the collector current of transistor $T_7$ is higher than that of transistor $T_5$ and thus, the addition of the third current mirror circuit allows a faster turn-off of transistor $T_2$.

The cut-off of transistor $T_2$ may thus have already occurred before the collector current of transistor $T_7$ has been significantly reduced.

Since the emitter of the final transistor $T_2$ is connected to an inductive load, when turn-off occurs, a counter electromotive force is induced in the inductive load and causes the potential of the emitter of transistor $T_2$ to fall below the reference level of $-V_{cc}$. The base potential of transistor $T_2$ also falls and the transistor $T_7$ is inversely biased thus terminating its charge removal activity.

In order to avoid a possible recirculation of the collector current of transistor $T_7$ during this bias condition, the diode $D_2$ is interposed between the collector of transistor $T_7$ and the base of transistor $T_2$.

The emitter of transistor $T_5$ is connected to the emitter of transistor $T_2$ and therefore, in all cases, has the same potential as the latter, but is however, maintained in forward conduction, thus absorbing the collector current of transistor $T_1$ in the turn-off phase and thus preventing the collector current of transistor $T_1$ from causing transistor $T_2$ to turn on again.

When transistor $T_1$ is also cut off, the current mirror circuits are deactivated because their action is no longer necessary.

The operation of the control circuit means and the timed enabling circuit means will now be examined in greater detail.

It is assumed that transistors $T_1$, $T_2$ and $T_8$ are initially conductive. The switching signal, generated by SW in order to control the turn-off of the final transistor $T_2$, also causes the simultaneous cut-off of transistors $T_8$ and $T_9$.

The cut-off of transistor $T_8$ causes the beginning of the turn-off phase of transistors $T_1$ and $T_2$; The cutoff of transistor $T_9$ acts such that the constant current imposed by current source $A_3$ and completely absorbed by transistor $T_9$ when the latter is conductive, may however flow in the base of transistor $T_{10}$, which is initially cut off, making it immediately conductive. The transistor $T_{10}$ activates the current mirror circuits and then transistors $T_3$, $T_5$ and $T_7$ start to remove the loads from transistors $T_1$ and $T_2$ which are still conductive. The transistor $T_{11}$ is driven to switching, in a similar manner to transistor $T_1$, by transistor $T_8$; transistor $T_{11}$ and current source $A_{11}$ are dimensioned such that current source $A_{11}$ imposes a collector current on transistor $T_{11}$ which is smaller than that imposed by the bias conditions of transistor $T_{11}$, until the collector current of transistor $T_1$ has a value such that it can keep transistor $T_2$ conductive; under such conditions, transistor $T_{11}$ is saturated and the transistors $T_{12}$ and $T_{13}$ are cut-off.

When transistor $T_1$ conducts a current which is smaller than the threshold current for the conduction of transistor $T_2$, then the collector current of transistor $T_{11}$ tends towards a value below that imposed by current source $A_{11}$, so that transistor $T_{11}$ is no longer saturated. At this point transistors $T_{12}$ and $T_{13}$ become conductive, disabling the active turn-off function and transistors $T_1$ and $T_2$ may again be made conductive without delay.

However, if a signal to turn transistors $T_1$ and $T_2$ on again reaches the control circuit means before the end of the fixed period of time for the activation thereof, the transistors $T_8$ and $T_9$ immediately become conductive again; as a result of which, transistor $T_{11}$ also becomes conductive, causing transistors $T_{12}$ and $T_{13}$ to be cut off while simultaneously, transistor $T_9$ again absorbs all the current from current source $A_3$, thereby turning off transistor $T_{10}$.

The charge removal means are thus simultaneously deactivated when the final transistor is turned on and the timed enabling circuit means is brought back to the initial conditions.

A control circuit according to the invention is particularly adapted to be integrated into a monolithic semiconductor chip using known integration techniques.

Although only one embodiment of the invention has been illustrated and described, it is obvious that many variations are possible without departing from the scope of the invention itself.

For example, the current mirror circuits included in the circuit diagrams of FIG. 1 and FIG. 2 may be replaced, with suitable circuit modifications within the scope of a person skilled in the art, by more complex current mirror circuits which have a circuit arrangement adapted to make the circuit insensitive to temperature or supply voltage variations. Furthermore, suitable resistances may be substituted for the diodes $D_5$ and $D_7$ for the purpose of incrementing the current gain of the transistors $T_5$ and $T_7$ and reducing their turn-off time, thus compensating for the lesser accuracy of the values of the collector current of transistors $T_5$ and $T_7$ with respect to the values obtained with the diodes.

In a different embodiment of the invention, the enabling circuit means may be formed of a monostable having strictly constant enabling times which can be determined at will.

We claim:

1. A control circuit for switching an inductive load, said circuit comprising:
   a control circuit means connected to a source of switching signals, said means generating electrical pulses in response to said signals, said pulses each having a leading and trailing edge;
   a first and a second transistor, each having a first, a second, and a control terminal; wherein one of said first and second terminals of said first transistor is connected to one terminal of a two terminal D.C. supply voltage, the other of said first and second terminals and said control terminal of said first transistor being respectively connected to said control terminal of said second transistor and to said control circuit means, said first transistor being made conductive by said pulses generated by said circuit means;
   wherein the second transistor, by means of its first and second terminals, is inserted in series with an inductive load which is connected between said two terminals of said D.C. supply voltage;

further comprising a charge removing circuit means, connected to the control terminal of at least one of said first and second transistors for removing a charge therefrom and coupled to the control circuit means which controls the activation thereof in correspondance with said trailing edge of each of said pulses which make said first transistor conductive, and still further comprising a timed enabling circuit means which is also coupled to said control circuit means which is enabled by said enabling circuit means so as to keep said charge removing circuit means operative for a fixed period of time, which is at most equal to the period of time which elapses between said trailing edge of each of said pulses and said leading edge of the following one of said pulses.

2. A circuit according to claim 1, wherein said first and second transistors are respectively of a first and a second type of conductivity which are opposite to one another, and wherein said first and second terminals of said first transistor are respectively connected to a first terminal of said D.C. supply voltage and to said control terminal of said second transistor, and wherein said first and second terminals of said second transistor are respectively connected to a second terminal of said D.C. supply voltage through said inductive load and to said first terminal of said D.C. supply voltage.

3. A control circuit for switching an inductive load, said circuit comprising:
   a control circuit means connected to a source of switching signals, said means generating electrical pulses in response to said signals, said pulses each having a leading and trailing edge;
   a first and a second transistor, each having a first, a second, and a control terminal; wherein one of said first and second terminals of said first transistor is connected to one terminal of a two terminal D.C. supply voltage, the other of said first and second terminals and said control terminal of said first transistor being respectively connected to said control terminal of said second transistor and to said control circuit means, said first transistor being made conductive by said pulses generated by said circuit means;
   wherein the second transistor, by means of its first and second terminals, is inserted in series with an inductive load connected between said two terminals of said D.C. supply voltage;
   further comprising a charge removing circuit means, connected to the control terminal of at least one of said first and second transistors for removing a charge therefrom and coupled to the control circuit means which controls the activation thereof in correspondance with said trailing edge of each of said pulses which make said first transistor conductive, and still further comprising a timed enabling circuit means which is also coupled to said control circuit means which is enabled to said enabling circuit means so as to keep said charge removing circuit means operative for a fixed period of time, which is at most equal to the period of time which elapses between said trailing edge of each of said pulses and said leading edge of the following one of said pulses;
   wherein said first and second transistors are respectively of a first and a second type of conductivity which are opposite to one another, and wherein said first and second terminals of said first transistor are respectively connected to a first terminal of said D.C. supply voltage and to said control terminal of said second transistor, and wherein said first and second terminals of said second transistor are respectively connected to a second terminal of said D.C. supply voltage through said inductive load and to said first terminal of said D.C. supply voltage;

wherein said charge removing circuit means comprises a third, a fourth, and a fifth transistor, each transistor having a first, a second, and a control terminal, said third and fourth transistor being of said first type of conductivity and said fifth transistor being of said second type of conductivity, wherein said control terminals of said third and fourth transistors are both connected to a cathode of a first diode and to said control circuit means, and an anode of said first diode and said first terminal of said third and fourth transistors are connected to said first terminal of said D.C. supply voltage, and wherein said second terminal of said third transistor is connected to said control terminal of said first transistor, and said second terminal of said fourth transistor is connected to said control terminal of said fifth transistor, and said first terminal of said fifth transistor is connected to both its own control terminal through a first resistive element and to said first terminal of said second transistor, and said second terminal of said fifth transistor is connected to said control terminal of said second transistor.

4. A circuit according to claim 3, wherein said charge removing circuit means comprises a sixth and a seventh transistor, said sixth and seventh transistors respectively being of said first and second types of conductivity and each having a first, a second and a control terminal, wherein said control terminal of said sixth transistor is connected to said cathode of said first diode and to said control circuit means, and said first and second terminals of said sixth transistor are respectively connected to said first terminal of said DC supply voltage and to said control terminal of said seventh transistor, and wherein said first and second terminals of said seventh transistor are respectively connected to said second terminal of said D.C. supply voltage, to which is also connected said control terminal of said seventh transistor through a second resistive element, and a cathode of a second diode, an anode of which is connected to said control terminal of said second transistor.

5. A circuit according to claim 3, wherein said resistive element comprises a resistor.

6. A circuit according to claim 3, wherein said resistive element comprises a diode.

7. A circuit according to claim 4, wherein said resistive elements comprise resistors.

8. A circuit according to claim 4, wherein said resistive elements comprise diodes.

9. A circuit according to claim 3, wherein said control circuit means comprises eighth, ninth and tenth transistors, said eighth, ninth, and tenth transistors being of said second type of conductivity and each having first, second, and control terminals, wherein:
   said control terminals of said eighth and ninth transistor are connected to said source of switching signals, and to an anode of a third diode, a cathode of said third diode being connected to said second terminal of said D.C. supply voltage;

said first and second terminals of said eighth transistor are respectively connected to said second terminal of said D.C. supply voltage and to both said control terminal of said first transistor and to a cathode of a fourth diode, an anode of said fourth diode being connected to said first terminal of said D.C. supply voltage;

said second terminal of said ninth transistor is connected to said control terminal of said tenth transistor and connected to said first terminal of said D.C. supply voltage by means of a first constant current generator, and connected to an anode of a fifth diode;

said first terminal of said ninth and tenth transistors and a cathode of said fifth diode are connected to said second terminal of said D.C. supply voltage, said second terminal of said tenth transistor is connected to said control terminals of said third, fourth and sixth transistors and connected to said cathode of said first diode;

and wherein said timed enabling circuit means comprises:

eleventh, twelfth, and thirteenth transistors, each having first, second and control terminals, said eleventh and twelfth transistors being of said first type of conductivity and said thirteenth transistor being of said second type of conductivity;

said control terminal of said eleventh transistor is connected to said second terminal of said eighth transistor and to said cathode of said fourth diode;

said first and second terminals of said eleventh transistor are respectively connected to said first terminal said D.C. supply voltage and to said control terminal of said twelfth transistor and further connected by means of a second constant current generator to said second terminal of said D.C. supply voltage;

said control terminal of said twelfth transistor is also connected to a cathode of a sixth diode, an anode of said sixth diode being connected to said first terminal of said DC supply voltage;

said first and second terminals of said twelfth transistor are respectively connected to said first terminal of said D.C. supply voltage and to both said control terminal of said thirteenth transistor and an anode of a seventh diode;

a cathode of said seventh diode and said first terminal of said thirteenth transistor are connected to said second terminal of said D.C. supply voltage;

said second terminal of said thirteenth transistor is also connected to said second terminal of said ninth transistor.

10. A circuit according to claim 9, wherein said eleventh and first transistors have approximately the same physical and electrical characteristics.

11. A circuit according to claim 1, wherein each of said transistors comprise bipolar transistors, wherein said first terminal, control terminal and second terminal of each of said rransistors respectively comprise an emitter, a base and a collector of said bipolar transistor.

12. A circuit according to claim 2, wherein each of said transistors comprise bipolar transistors, wherein said first terminal, control terminal and second terminal of each of said transistors respectively comprise an emitter, a base and a collector of said bipolar transistor.

13. A circuit according to claim 3, wherein each of said rransistors comprise bipolar transistors, wherein said first terminal, control terminal and second terminal of each of said transistors respectively comprise an emitter, a base and a collector of said bipolar transistor.

14. A circuit according to claim 4, wherein each of said transistors comprise bipolar transistors, wherein said first terminal, control terminal and second terminal of each of said transistors respectively comprise an emitter, a base and a collector of said bipolar transistor.

15. A circuit according to claim 5, wherein each of said transistors comprise bipolar transistors, wherein said first terminal, control terminal and second terminal of each of said transistors respectively comprise an emitter, a base and a collector of said bipolar transistor.

16. A circuit according to claim 6, wherein each of said transistors comprise bipolar transistors, wherein said first terminal, control terminal and second terminal of each of said transistors respectively comprise an emitter, a base and a collector of said bipolar transistor.

17. A circuit according to claim 7, wherein each of said transistors comprise bipolar transistors, wherein said first terminal, control terminal and second terminal of each of said transistors respectively comprise an emitter, a base and a collector of said bipolar transistor.

18. A circuit according to claim 8, wherein each of said transistors comprise bipolar transistors, wherein said first terminal, control terminal and second terminal of each of said transistors respectively comprise an emitter, a base and a collector of said bipolar transistor.

19. A circuit according to claim 9, wherein each of said transistors comprise bipolar transistors, wherein said first terminal, control terminal and second terminal of each of said transistors respectively comprise an emitter, a base and a collector of said bipolar transistor.

20. A circuit according to claim 10, wherein each of said transistors comprise bipolar transistors, wherein said first terminal, control terminal and second terminal of each of said transistors respectively comprise an emitter, a base and a collector of said bipolar transistor.

* * * * *